(12) United States Patent
Hatano et al.

(10) Patent No.: US 6,399,485 B1
(45) Date of Patent: Jun. 4, 2002

(54) SEMICONDUCTOR DEVICE WITH SILICIDE LAYERS AND METHOD OF FORMING THE SAME

(75) Inventors: Keisuke Hatano; Tsuyoshi Nagata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/628,435

(22) Filed: Jul. 28, 2000

(30) Foreign Application Priority Data

Jul. 28, 1999 (JP) .......................................... 11-214235

(51) Int. Cl.[7] .............................................. H01L 21/44
(52) U.S. Cl. ....................... 438/655; 438/592; 438/301; 438/307; 438/664; 438/659
(58) Field of Search ................................ 438/655, 592, 438/659, 660, 663–664, 682–683, 299–301, 306–307

(56) References Cited

U.S. PATENT DOCUMENTS

| | | | | |
|---|---|---|---|---|
| 5,273,914 A | * | 12/1993 | Miyajima et al. ..... | 148/DIG. 15 |
| 5,525,529 A | * | 6/1996 | Guldi ..................... | 148/DIG. 7 |
| 5,904,508 A | * | 5/1999 | Codama et al. ............. | 438/151 |
| 5,908,309 A | * | 6/1999 | Andoh ........................ | 438/231 |
| 6,100,170 A | * | 8/2000 | Matsumoto et al. ........ | 438/528 |
| 6,228,766 B1 | * | 5/2001 | Fujii ........................... | 438/110 |
| 6,313,021 B1 | * | 11/2001 | Merchant et al. ........... | 438/592 |

FOREIGN PATENT DOCUMENTS

| | | | |
|---|---|---|---|
| JP | 4-287928 | 10/1992 | |
| JP | 7-30088 | 1/1995 | |
| JP | 8-97370 | 4/1996 | |
| JP | 9-27620 | 1/1997 | |
| JP | 9-92830 | 4/1997 | |
| JP | 10-98175 | 4/1998 | |
| JP | 10-172920 | 6/1998 | |
| JP | 410303316 | * 11/1998 | ....... H01L/21/8238 |
| JP | 411330271 | * 11/1999 | ....... H01L/21/8238 |

* cited by examiner

Primary Examiner—Chandra Chaudhari
Assistant Examiner—Thanh Nguyen
(74) Attorney, Agent, or Firm—Young & Thompson

(57) ABSTRACT

The present invention provides a semiconductor device having: at least a first diffusion layer having a first impurity concentration; at least a second diffusion layer having a first impurity concentration which is lower than the first impurity concentration, and the first and second diffusion layers being of the same conductivity type, wherein a silicide layer is formed over the first diffusion layer, while no silicide layer is formed over the second diffusion layer.

3 Claims, 34 Drawing Sheets

SEMICONDUCTOR DEVICE WITH SILICIDE LAYERS AND METHOD OF FORMING THE SAME

BACKGROUND OF THE INVENTION

The present invention relates to a semiconductor device and a method of forming the same, and more particularly to a semiconductor device having plural diffusion layers different in impurity concentration, wherein selected ones of the plural diffusion layers are formed with silicide layers as well as a method of forming the same.

As shrinkage of the semiconductor devices have been on the progressed, it has been required to form sallow diffusion layers. Making the diffusion layers shallower increases the resistance of the diffusion layer, thereby making it difficult for the semiconductor device to exhibit high speed performances In order to reduce the resistance of the diffusion layer, it is effective to form the silicide layer on the diffusion layer This technique for forming the silicide layer on the diffusion layer has been applied to a solid state image pick tip device having plural diffusion layers different in impurity concentration The solid state image pick up device has a photo-receiving region having diffusion layers of relatively low impurity concentrations, and a charge transfer region having a MOS transistor having source and drain diffusion layers of high impurity concentration.

FIGS. 1A through 1G are fragmentary cross sectional elevation views illustrative of conventional solid state image pick up devices having diffusion layers, parts of which are formed with silicide layers.

With reference to FIG. 1A, field oxide films 302 are selectively formed on a passive region of a p-type silicon substrate 301 by a local oxidation of silicon method, whereby an active region or a device region is defined by the field oxide films 302. A gate oxide film 303 is formed on the device region or the active region of the p-type silicon substrate 301 by a thermal oxidation of silicon. A polysilicon film is entirely formed by a chemical vapor deposition method. A phosphorus is doped into the polysilicon film to reduce a resistance of the polysilicon film. The polysilicon film is then patterned o form polysilicon gate electrodes 304. A photo-resist film is selectively formed for carrying out an ion-implantation of an n-type impurity into a shallow region of the photo-receiving region of the p-type silicon substrate 301 by use of the photo-resist as a mask at a low impurity concentration thereby to form an n$^-$-type diffusion region 305 on the photo-receiving region of the p-type silicon substrate 301. The used photo-resist film is removed. In place, another photo-resist film is selectively formed. The other photo-resist film is used as a mask for carrying out another ion-implantation of an n-type impurity into a shallow region of the charge transfer region of the p-type silicon substrate 301 at a high impurity concentration thereby to form n$^+$-type source and drain diffusion regions 306 on the charge transfer region of the p-type silicon substrate 301. The other photo-resist is then removed.

With reference to FTG. 1B, a silicon oxide film 307 having a thickness of about 25 nanometers is entirely formed which extends over the field oxide films 302, the n$^+$-type source and drain diffusion regions 306, the n$^-$-type diffusion region 305, and the polysilicon gate electrodes 304.

With reference to FIG. 1C, an ion-implantation of an n-type impurity of arsenic is carried out at a dose of about 1E14 /cm2 to introduce the arsenic through the silicon oxide film 307 into upper regions of the polysilicon gate electrodes 304, the n$^-$-type diffusion region 305, and the n$^+$-type source and drain diffusion regions 306 for snaking the above upper regions amorphous, whereby amorphous silicon layers 310 are selectively formed in the upper regions of the polysilicon gate electrodes 304, the n$^-$-type diffusion region 305, and the n$^+$-type source and drain diffusion regions 306.

With reference to FIG. 1D, a silicon oxide film 309 having a thickness of about 50 nanometers is entirely formed on the silicon oxide film 307.

With reference to FIG. 1E, a photo-resist film 308 is selectively formed over the photo-receiving region so that the photo-resist film 308 covers the n$^-$-type diffusion region 305 and the field oxide films 302. The laminations of the silicon oxide films 307 and 309 are selectively removed by use of the photo-resist film 309 as a mask so as to remove the laminations of the silicon oxide films 307 and 309 from the charge transfer region.

With reference to FIG. 1F, the photo-resist film 308 is removed. A titanium film 311 is entirely deposited by a stuttering method, so that the titanium film 311 extends over the field oxide film 302, the amorphous silicon regions 310 over the n$^+$-type source and drain diffusion regions 306, and the other amorphous silicon regions 310 over the polysilicon gate electrodes 304 as well as over the remaining part of the silicon oxide film 309.

With reference to FIG. 1G, a heat treatment, for example, an anncal is carried out at a temperature in the range of 600–900° C. to cause a silicidation reaction of silicon in the amorphous silicon regions 310 with titanium of the titanium film 311, whereby titanium silicide layers 312 having a thickness of about 30 nanometers are selectively formed over the n$^+$-type source and drain diffusion regions 306, and over the polysilicon gate electrode 304 in the charge transfer region, whilst the unreacted titanium film remains 311 over the field oxide film 302 and over the silicon oxide film 309. The unreacted titanium film 311 is then removed by a mixture of ammonia solution with hydrogen peroxide solution. As a result, the polycide gate is formed in the charge transfer region. Since the silicidation reaction is caused between the titanium film with the amorphous silicon regions 310, then the titanium silicide layers 312 are thick and have a reduced resistance.

Although illustration is omitted, an inter-layer insulator is entirely formed over the charge transfer region and the photo-receiving region. Contact holes are selectively formed in the inter-layer insulator, so that the contact holes reach the titanium silicide layers 312 over the n$^+$-type source and drain diffusion regions 306. Contact plugs are selectively formed in the contact holes and an aluminum interconnection layer is formed over the inter-layer insulator so that the aluminum interconnection layer is connected through the contact plugs to the titanium silicide layers 312 over the n$^+$-type source and drain diffusion regions 306.

As described above, in order to form the amorphous silicon regions, an ion-implantation of arsenic into all of the diffusion layers is carried out at a relatively high dose, for example, about 1E14 /cm2. Namely, arsenic is ion-implanted into not only the n$^+$-type source and drain diffusion regions 306 but also the n$^-$-type diffusion region 305 having the low impurity concentration in the photo-receiving region, whereby the surface region of the n$^-$-type diffusion region 305 is increased and made much higher than 1E14 /cm2. It is, therefore, impossible to form the diffusion layer having the lower impurity concentration than about 1E14 /cm2.

In order to avoid the above problem, it is required to selectively make the diffusion layers amorphous. In Japanese laid-open patent publication No. 11-40679, it is disclosed that amorphous silicon layers are selectively formed over diffusion layers in a first region and no amorphous silicon layers are formed in a second region, before first silicide layers are formed on first interfaces between the amorphous silicon regions and the titanium layer, whilst second silicide layers are formed on second interfaces between the silicon regions and the titanium layer, wherein the first silicide layers are thicker than the second silicide layers. This conventional technique is to form concurrently silicide layers different in thickness from each other. The conventional technique is never to form selectively the silicide layers over the diffusion layers of the high impurity concentration but no silicide layers over the diffusion layers of the low impurity concentration. The conventional technique is never settle the above problems to be solved by the present invention.

In the above circumstances, it had been required to develop a novel semiconductor device and method of forming the same free from the above problem.

SUMMARY OF THE INVENTION

Accordingly, it is an object of the present invention to provide a novel semiconductor device free from the above problems.

It is a further object of the present invention to provide a novel semiconductor device having at least a first diffusion layer having a first impurity concentration and at least a second diffusion layer having a second impurity concentration lower than the first impurity concentration, wherein a silicide layer is formed over the first diffusion layer whilst no silicide layer is formed over the second diffusion layer.

It is a still further object of the present invention to provide a novel method of forming a semiconductor device free from the above problems.

It is yet a further object of the present invention to provide a novel method of forming a semiconductor device having at least a first diffusion layer having a first impurity concentration and at least a second diffusion layer having a second impurity concentration lower than the first impurity concentration, wherein a silicide layer is formed over the first diffusion layer whilst no silicide layer is formed over the second diffusion layer.

The first present invention provides a semiconductor device having; at least a first diffusion layer having a first impurity concentration; at least a second diffusion layer having a first impurity concentration which is lower than the first impurity concentration, and the first and second diffusion layers being of the same conductivity type, wherein a silicide layer is formed over the first diffusion layer, whilst no silicide layer is formed over the second diffusion layer.

The second present invention provides a method of selectively forming a silicide layer in a semiconductor device having a first impurity concentration; at least a second diffusion layer having a first impurity concentration which is lower than the first impurity concentration, and the first and second diffusion layers being of the same conductivity type. The comprises the steps of: forming a mask layer at least over the second diffusion layer; carrying out a first ion-implantation of an impurity of the same conductivity type as the first and second diffusion layers by use of the mask layer as a mask so as to ion-implant the impurity into an upper region of the first diffusion layer, whereby an amorphous silicon layer is formed over the first diffusion layer whilst no amorphous silicon layer is formed over the second diffusion layer; forming a metal layer on the amorphous silicon layer over the first diffusion layer and also on the mask layer; and carrying out a heat treatment to cause a silicidation reaction of metal in the metal layers with silicon in the amorphous silicon layer whereby a metal silicide layer is selectively formed over the first diffusion layer whilst no silicide layer is formed over the second diffusion layer.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1A:
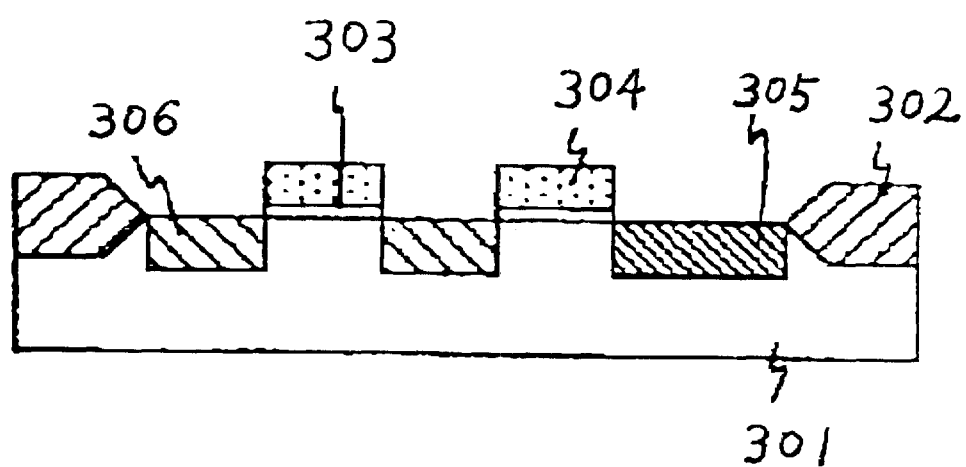
FIGS. 1A through 1G are fragmentary cross sectional elevation views illustrative of conventional solid state image pick up devices having diffusion layers, parts of which are formed with suicide layers.
Figure 1B:
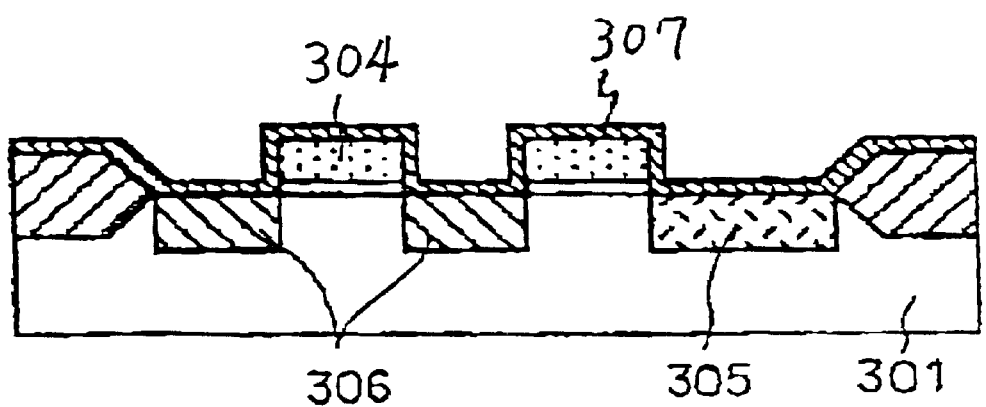
Figure 1C:
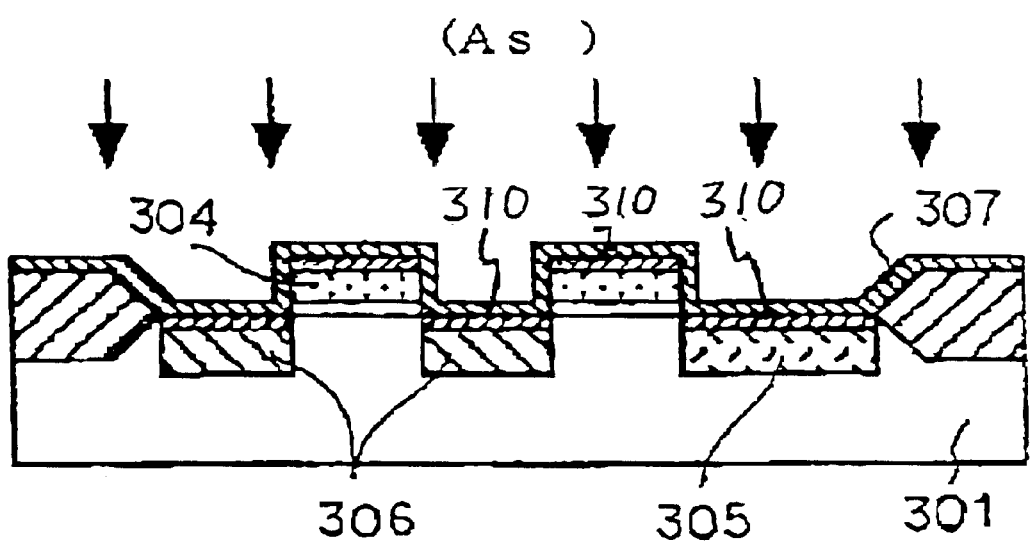
Figure 1D:
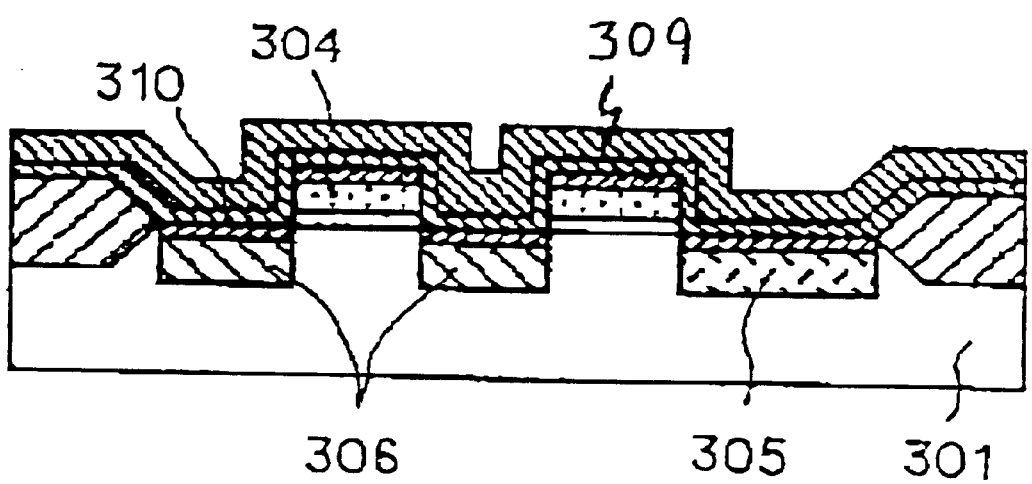
Figure 1E:
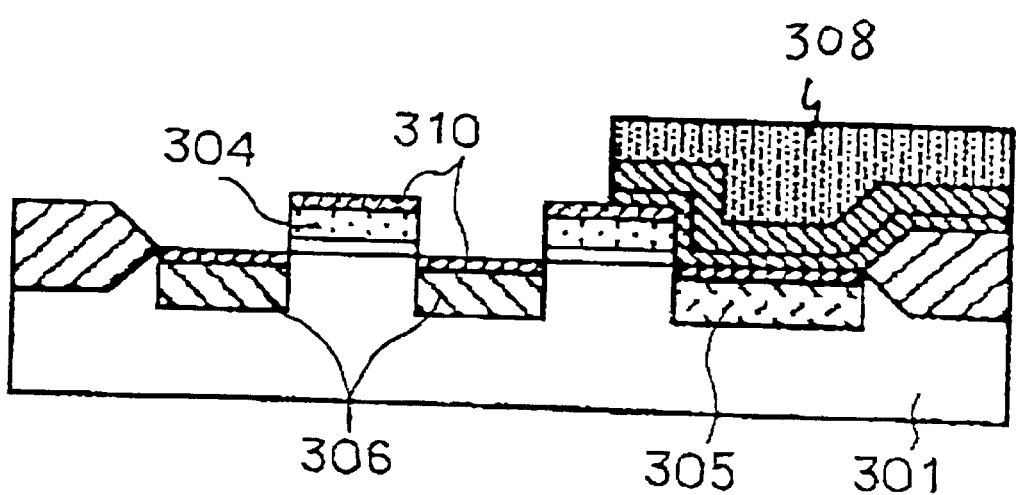
Figure 1F:
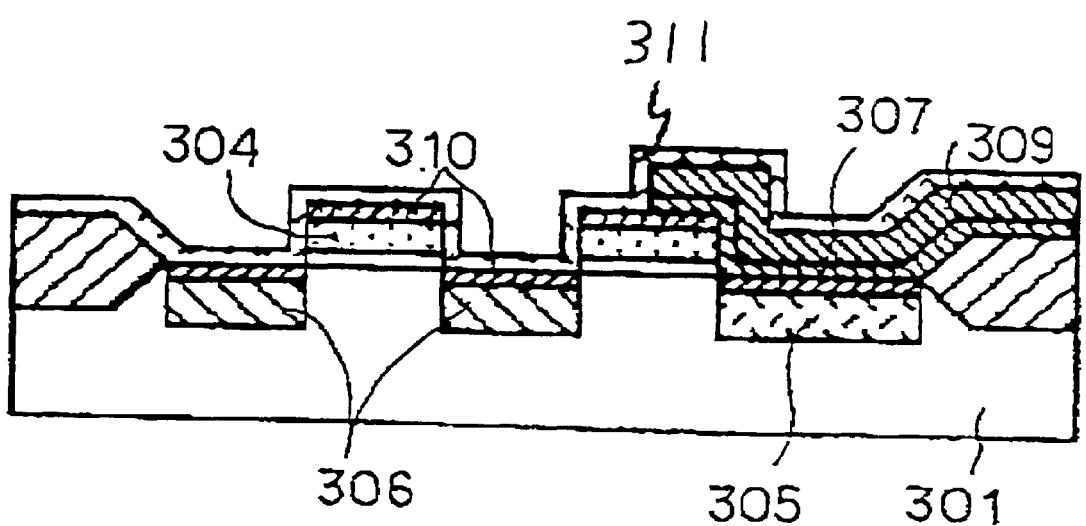
Figure 1G:
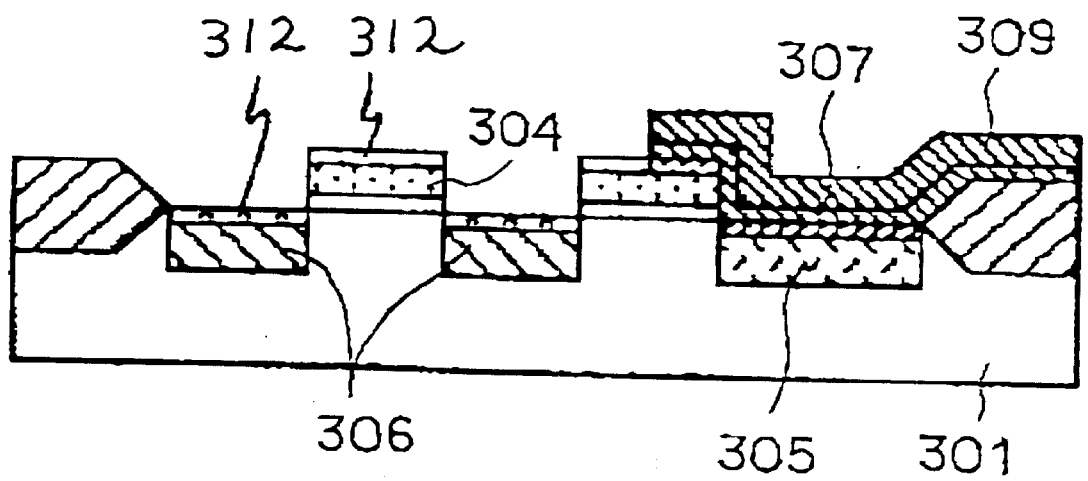

The first present invention provides a semiconductor device having: at least a first diffusion layer having a first impurity concentration; at least a second diffusion layer having a first impurity concentration which is lower than the first impurity concentration, and the first and second diffusion layers being of the same conductivity type, wherein a silicide layer is formed over the first diffusion layer, whilst no silicide layer is formed over the second diffusion layer.

It is preferable that two of the first diffusion layer are formed in a charge transfer region, whilst two of the second diffusion layer are formed in a photo-receiving region.

It is also preferable that two of the first diffusion layer are formed in a charge transfer region, whilst one of the second diffusion layer is formed in a photo-receiving region, so that an edge of the second diffusion layer is bounded with one of the two of the first diffusion layer.

The second present invention provides a method of selectively forming a silicide layer in a semiconductor device having a first impurity concentration; at least a second diffusion layer having a first impurity concentration which is lower than the first impurity concentration, and the first and second diffusion layers being of the same conductivity type. The comprises the steps of: forming a mask layer at last over the second diffusion layer; carrying out a first ion-implantation of an impurity of the same conductivity type as the first and second diffusion layers by use of the mask layer as a mask so as to ion-implant the impurity into an upper region of the first diffusion layer, whereby an amorphous silicon layer is formed over the first diffusion layer whilst no amorphous silicon layer is formed over the second diffusion layer; forming a metal layer on the amorphous silicon layer over the first diffusion layer and also on the mask layer; and carrying out a heat treatment to cause a silicidation reaction of metal in the metal layers with silicon in the amorphous silicon layer whereby a metal silicide layer is selectively formed over the first diffusion layer whilst no silicide layer is formed over the second diffusion layer.

It is preferable further comprise the step of: after forming the mask layer, entirely forming a thin silicon oxide film over the first diffusion layer and the mask layer, so that the first ion-implantation is made through the thin silicon oxide film into an upper region of the first diffusion layer, so that tire amorphous silicon layer is formed over the first diffusion layer; and removing the thin silicon oxide film before the metal film is formed.

It is preferable that the mask layer comprises a thick silicon oxide film having a thickness larger than a range of ions of the first ion-implantation, so that the impurity is prevented from penetrating the mask layer and reaching the second diffusion layer.

PREFERRED EMBODIMENT
First Embodiment:

A first embodiment according to the present invention will be described in detail with reference to the drawings.

FIGS. 2A through 2I are fragmentary cross sectional elevation views illustrative of novel solid state image pick up devices having diffusion layers, parts of which are formed with silicide layers in a first embodiment in accordance with the present invention.

Figure 2A:
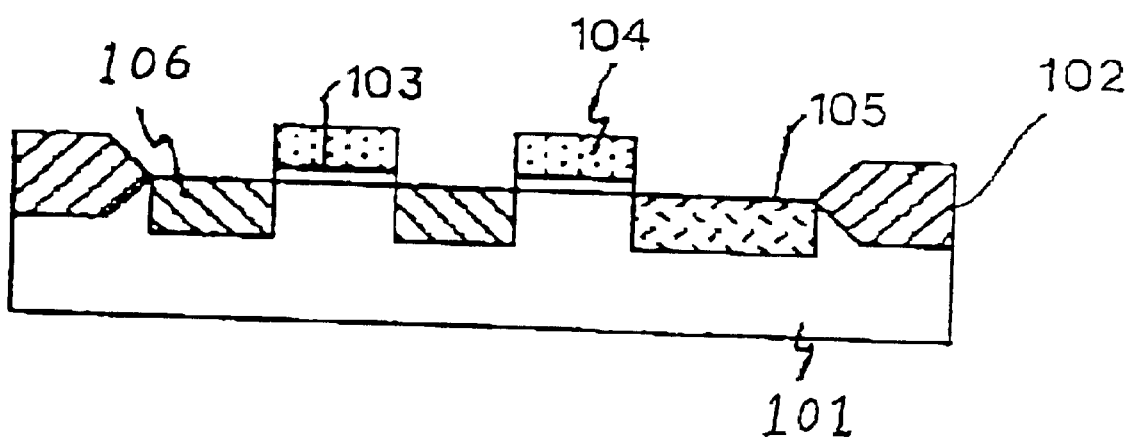
FIGS. 2A through 2I are fragmentary cross sectional elevation views illustrative of novel solid state image pick up devices having diffusion layers, parts of which are formed with silicide layers in a first embodiment in accordance with the present invention.

With reference to FIG. 2A, field oxide films 102 are selectively formed on a passive region of a p-type silicon substrate 101 by a local oxidation of silicon method, whereby an active region or a device region is defined by the field oxide films 102. A gate oxide film 103 is formed on the device region or the active region of the p-type silicon substrate 101 by a thermal oxidation of silicon. A polysilicon film is entirely formed by a chemical vapor deposition method. A phosphorus is doped into the polysilicon film to reduce a resistance of the polysilicon film. The polysilicon film is then patterned o form polysilicon gate electrodes 104. A photo-resist film is selectively formed for carrying out an ion-implantation of an n-type impurity into a shallow region of the photo-receiving, region of the p-type silicon substrate 101 by use of the photo-resist as a mask at a low impurity concentration thereby to form an n$^-$-type diffusion region 105 on the photo-receiving region of the p-type silicon substrate 101. The used photo-resist film is removed. In place, another photo-resist film is electively formed. The other photo-resist film is used as a mask for carrying out another ion-implantation of an n-type impurity into a shallow region of the charge transfer region of the p-type silicon substrate 101 at a high impurity concentration thereby to form n$^+$-type source and drain diffusion regions 106 on the charge transfer region of the p-type silicon substrate 101. The other photo-resist is then removed.

Figure 2B:
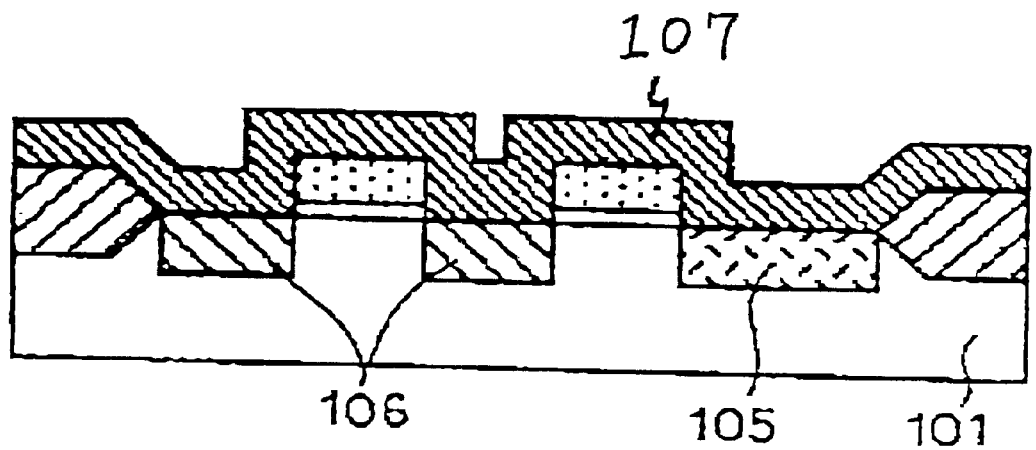

With reference to FIG. 2B, a thick silicon oxide film 107 having a thickness of about 100 nanometers is entirely formed which extends over the field oxide films 102, the n$^+$-type source and drain diffusion regions 106, the n$^-$-type diffusion region 105, and the polysilicon gate electrodes 104. The thickness of the silicon oxide film 107 is so thick that the arsenic ion-implanted does not penetrate the silicon oxide film 107, whereby no arsenic is implanted into the n$^-$-type diffusion region 105.

Figure 2C:
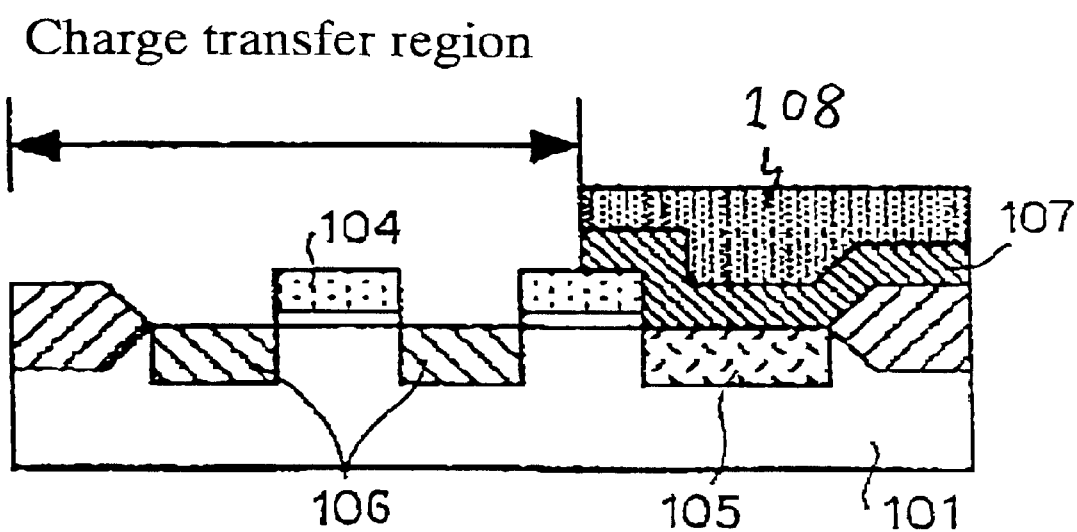

With reference to FIG. 2C, a photo-resist 108 is selectively formed on the silicon oxide film 107 in the photo-receiving region The photo-resist film 108 is used as a mask for selectively removing the silicon oxide film 107 from the charge transfer region.

Figure 2D:
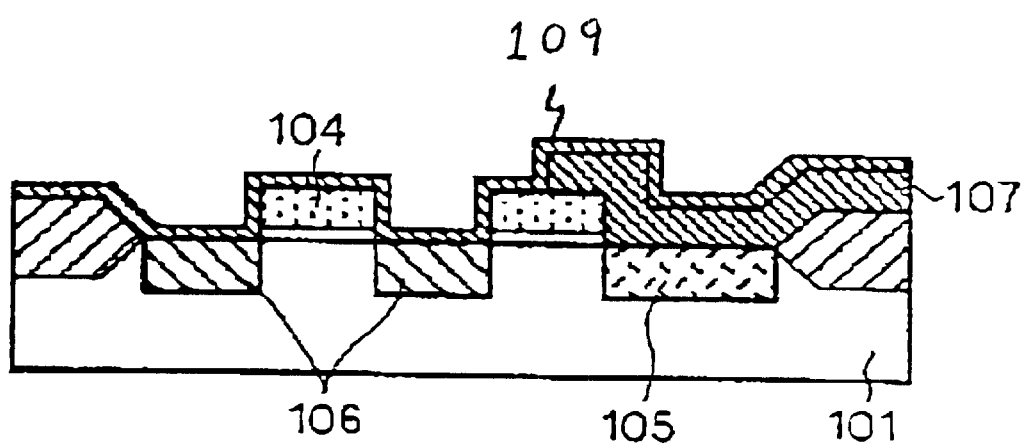

With reference to FIG. 2D, the used photo-resist film 108 is removed. A silicon oxide film 109 having a thickness of about 25 nanometers is entirely formed which extends over the field oxide film 102, the n$^+$-type source and drain diffusion regions 106 and the polysilicon gate electrode 104 as well as over the silicon oxide film 107 in the photo-receiving region.

Figure 2E:
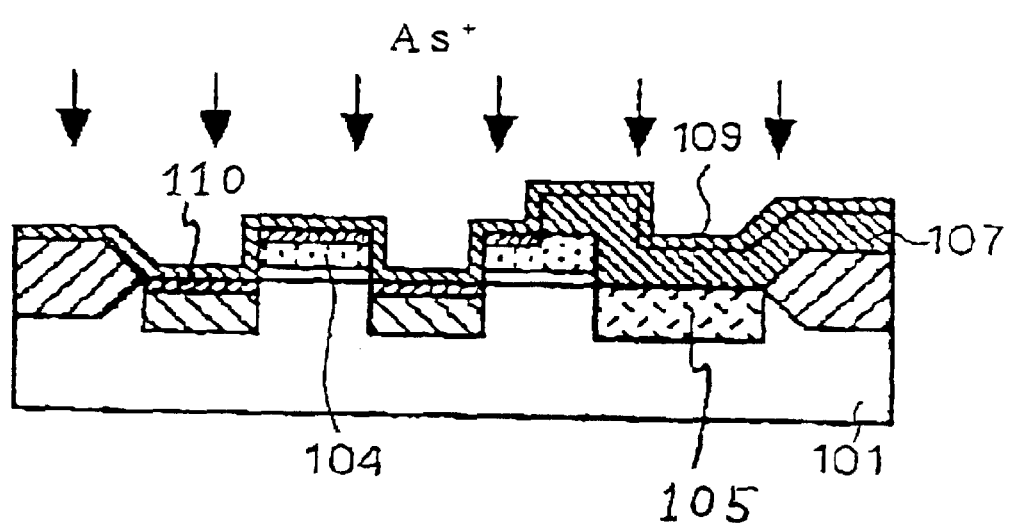
Figure 2F:
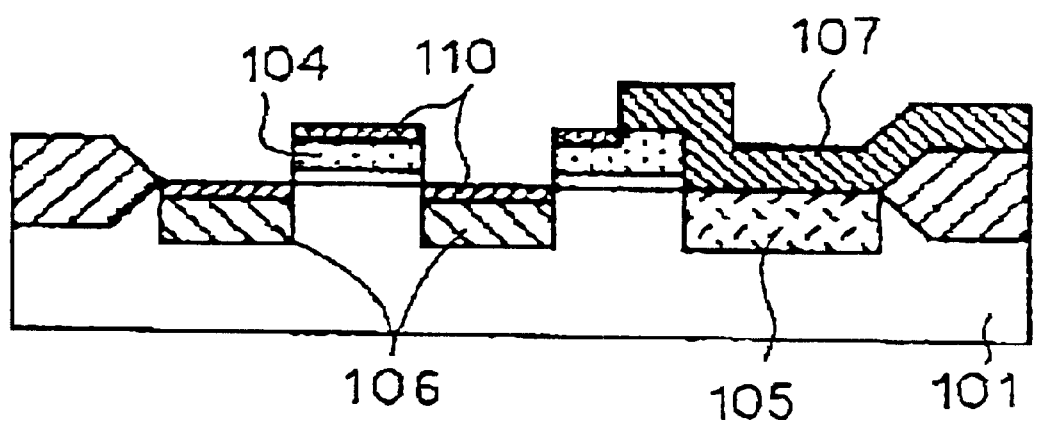

With reference to FIG. 2E, an ion-implantation of an n-type impurity of arsenic is carried out at a dose of about 1E14 /cm2 to introduce the arsenic through the silicon oxide film 109 into upper regions of the polysilicon gate electrodes 104, and the n$^+$-type source and drain diffusion regions 106 for making the above upper regions amorphous, whereby amorphous silicon layers 110 are selectively formed in the upper regions of the polysilicon gate electrodes 104, and the n$^+$-type source and drain diffusion regions 106. The silicon oxide film 107 serves as a mask to prevent the arsenic ion-implanted from penetrating the silicon oxide film 107 and reaching the n$^-$-type diffusion region 105. Namely, no arsenic is ion-implanted into the n$^-$-type diffusion region 105. Since the silicon oxide film 107 extends only in the photo-receiving region but not extend in the charge transfer region, then the arsenic is ion-implanted only into the n$^+$-type source and drain diffusion regions 106 and the polysilicon gate electrode 104 in the charge transfer region, whilst no arsenic is ion-implanted into the photo-receiving region. As a result, the amorphous silicon regions 110 are selectively formed in the upper regions of the n$^+$-type source and drain diffusion. regions 106 and the polysilicon gate electrode 104 in the charge transfer region, whilst no amorphous silicon region is then formed in the n-type diffusion region 105 on the photo-receiving region With reference to FIG. 2F, the silicon oxide film 109 is removed by a buffered fluorine acid solution, so that the silicon oxide film 107 is shown in the photo-receiving region and also there are shown the amorphous silicon layers 110 over the polysilicon gate electrode 104 and the n$^+$-type source and drain diffusion regions 106 in the charge transfer region. In place of the buffered fluorine acid solution, the dry etching process using CF$_4$ gas may also be available to remove the silicon oxide film 109.

Figure 2G:
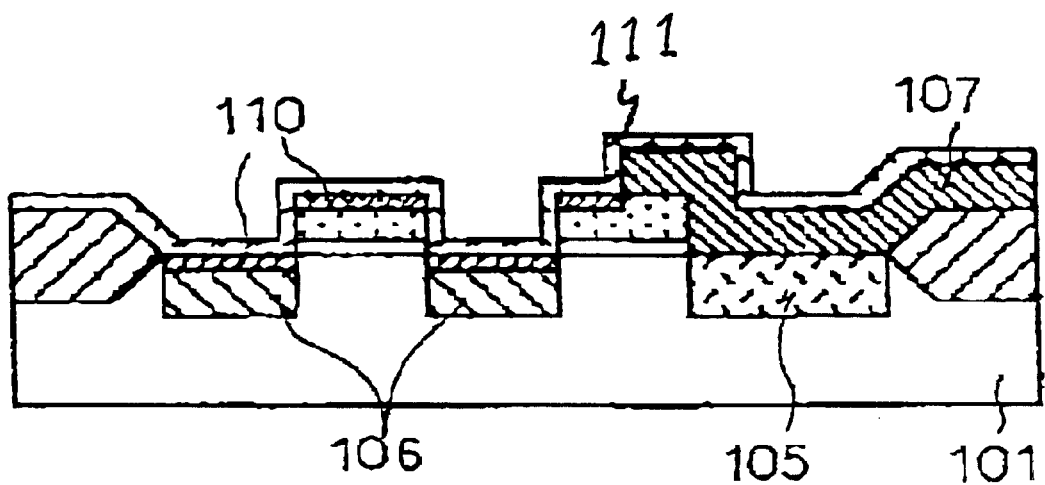

With reference to FIG. 2G, a titanium film 111 is entirely deposited by a stuttering method, so that the titanium film 111 extends over the field oxide film 102, the amorphous silicon regions 110 over the n$^+$-type source and drain diffusion regions 106, and the other amorphous silicon regions 110 over the polysilicon gate electrodes 104 in the charge transfer region as well as over the silicon oxide film 107 in the photo-receiving region.

Figure 2H:
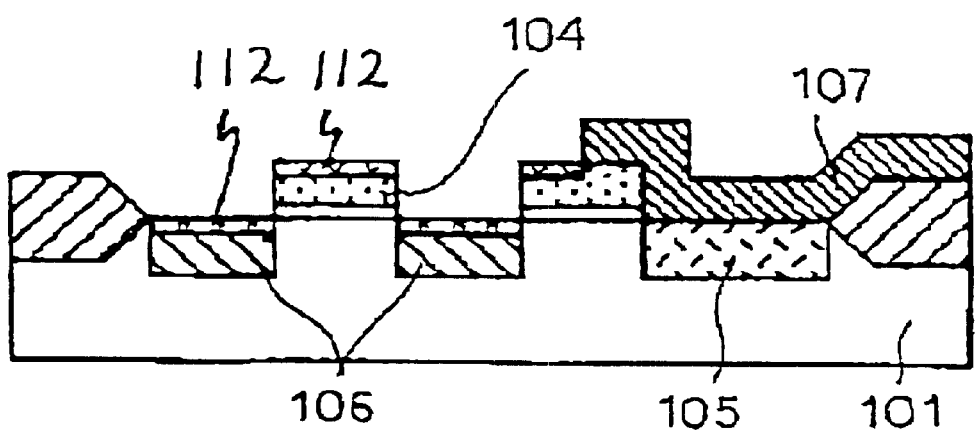
Figure 2I:
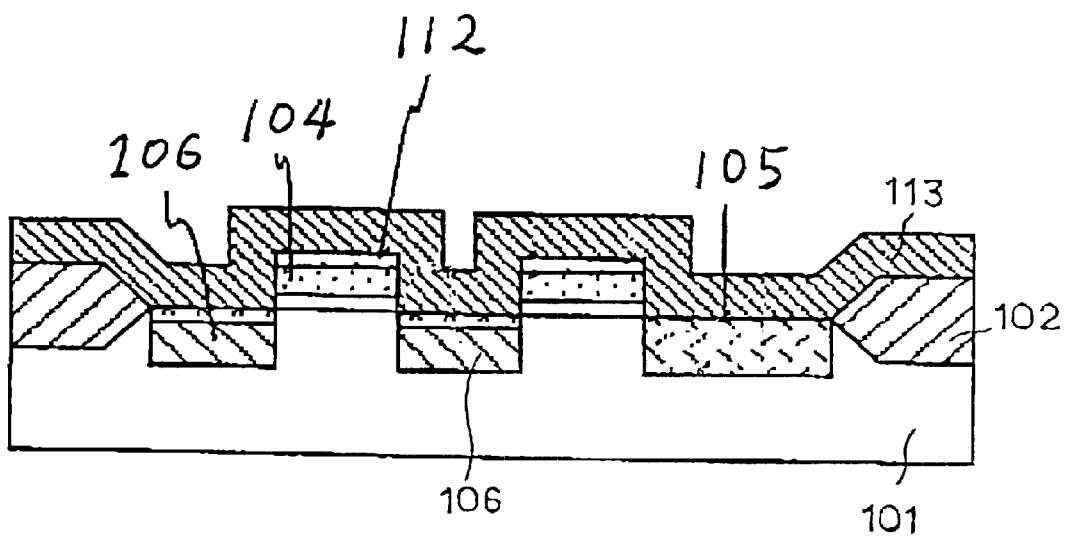

With reference to FIG. 2H, a heat treatment, for example, an anneal is carried out at a temperature in the range of 600–900° C. to cause a silicidation reaction of silicon in the amorphous silicon regions 110 with titanium of the titanium film 11, whereby titanium silicide layers 112 having a thickness of about 30 nanometers are selectively formed over the n$^+$-type source and drain diffusion regions 106, and over the polysilicon gate electrode 104 in the charge transfer region, whilst the unreacted titanium film remains 111 remains over the field oxide film 102 and over the silicon oxide film 107 in the photo-receiving region. The unreacted titanium film 111 is then removed by a mixture of ammonia solution with hydrogen peroxide solution. As a result, the polycide gate is formed in the charge transfer region. Since the silicidation reaction is caused between the titanium film with the amorphous silicon regions 110, then the titanium silicide layers 112 are thick and have a reduced resistance.

With reference to FIG. 21, an inter-layer insulator 113 is entirely formed over the charge transfer region and the photo-receiving region. Contact holes are selectively formed in the inter-layer insulator, so that the contact holes reach the titanium silicide layers 112 over the n$^+$-type source and drain diffusion regions 106. Contact plugs are selectively formed in the contact holes and an aluminum interconnection layer is formed over the inter-layer insulator so that the aluminum interconnection layer is connected through the contact plugs to the titanium silicide layers 112 over the n$^+$-type source and drain diffusion regions 106.

As described above, in accordance with the first embodiment of the present invention, the thick silicon oxide film 107 is selectively formed in the photo-receiving region so that the thick silicon oxide film 107 covers the n$^-$-type diffusion layer 105 having the low impurity concentration, before the arsenic is ion-implanted by use of the thick silicon oxide film 107 as a mask so that the arsenic is ion-implanted into the upper regions of the n$^+$-type source and drain diffusion regions 106 having the high impurity concentration and the polysilicon gate electrode 104 in the charge transfer region, whilst no arsenic is then ion-implanted into the n$^-$-type diffusion layer 105 having the low impurity concentration As a result, the amorphous silicon layers are selectively formed over the n$^+$-type source and drain diffusion regions 106 having the high impurity concentration and the polysilicon gate electrode 104 in the charge transfer region, whilst no amorphous silicon layer is then ion-implanted into the n$^-$-type diffusion layer 105 having the low impurity concentration. A titanium film 111 is then entirely deposited over the charge transfer region and the photo-receiving region, so that the titanium film 111 extends over the field oxide film 102, the n$^+$-type source and drain diffusion regions 106 and the polysilicon gate electrode 104 in the charge transfer region whilst the titanium film extends over the silicon oxide film 107 in the photo-receiving region. The silicidation reaction is caused of silicon in the amorphous silicon regions 110 with titanium of the titanium film 111 in the charge transfer region, whereby titanium silicide layers 112 are selectively fanned over the n$^+$-type source and drain diffusion regions 106, and over the polysilicon gate electrode 104 in the charge transfer region, whilst the unreacted titanium film remains 111 remains over the field oxide film 102 and over the silicon oxide film 107 in the photo-receiving region The unreacted titanium film 111 is then removed. As a results the high impurity concentration diffusion layers with the silicide layers are formed in the charge transfer region, whilst the low impurity concentration diffusion layers without silicide layers are formed in the photo-receiving region. Since the titanium silicide layer 112 has a low light-transitivity, the titanium silicide layer 112 is selectively formed over the high impurity concentration diffusion layers only in the charge transfer region to reduce the high impurity concentration diffusion layers, whilst no titanium silicide layer is formed over the low impurity concentration diffusion layer serving as a photo-receiving region, whereby no deterioration to photo-sensitivity is caused. Since the low impurity concentration diffusion layer is low in the impurity concentration, then it is possible to extend a space charge region of the low impurity concentration diffusion layer to improve the sensitivity of the photo-receiving region. Accordingly, the improved solid state image pick up device is obtained.

Second Embodiment:

A second embodiment according to the present invention will be described in detail with reference to the drawings.

FIGS. 3A through 3I are fragmentary cross sectional elevation views illustrative of a novel CMOS sensor having a photo-receiving region and a reset transistor, wherein the CMOS sensor has plural diffusion layers, parts of which are formed with silicide layers in a second embodiment in accordance with the present invention.

Figure 3A:
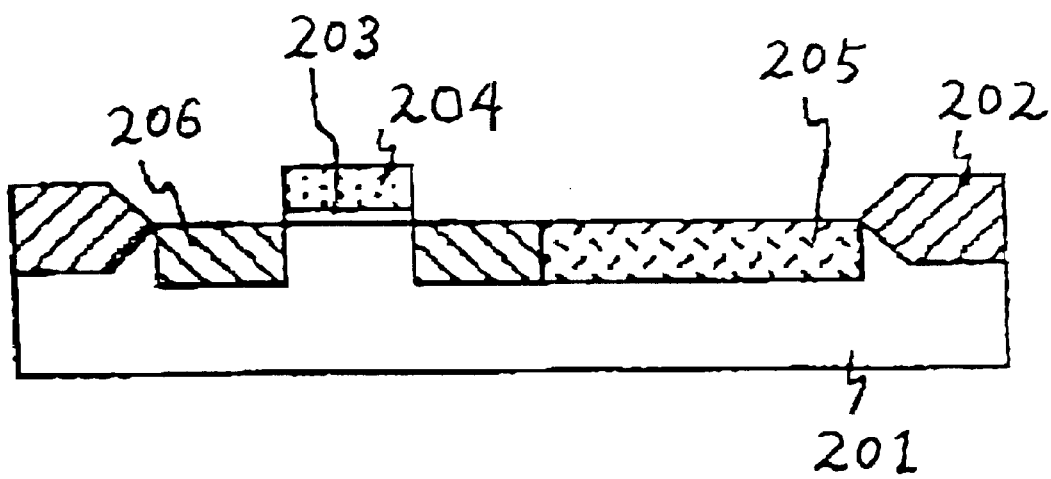
FIGS. 3A through 3I are fragmentary cross sectional elevation views illustrative of a novel CMOS sensor having a photo-receiving region and a reset transistor, wherein the CMOS sensor has plural diffusion layers, parts of which are formed with silicide layers in a second embodiment in accordance with the present invention.

With reference to FIG. 3A, field oxide films 202 are selectively formed on a passive region of a p-type silicon substrate 201 by a local oxidation of silicon method, whereby an active region or a device region is defined by the field oxide films 202. A gate oxide film 203 is formed on the device region or the active region of the type silicon substrate 201 by a thermal oxidation of silicon. A polysilicon film is entirely formed by a chemical vapor deposition method. A phosphorus is doped into the polysilicon film to reduce a resistance of the polysilicon films The polysilicon film is then patterned o form a polysilicon gate electrode 204. A photo-resist film is selectively formed for carrying out an ion-implantation of an n-type impurity into a shallow region of the photo-receiving region of the p-type silicon substrate 201 by use of the photo-resist as a mask at a low impurity concentration thereby to form an n$^-$-type diffusion region 205 on the photo-receiving region of the p-type silicon substrate 201. The used photo-resist film is removed. In place, another photo-resist film is selectively formed. The other photo-resist film is used as a mask for carrying out another ion-implantation of an n-type impurity into a shallow region of the charge transfer region of the p-type silicon substrate 201 at a high impurity concentration thereby to form n$^+$-type source and drain diffusion regions 206 on the charge transfer region of the p-type silicon substrate 201. One of the n$^+$-type source and drain diffusion regions 206 is bounded with the edge of the n$^-$-type diffusion region 205. The other photo-resist is then removed.

Figure 3B:
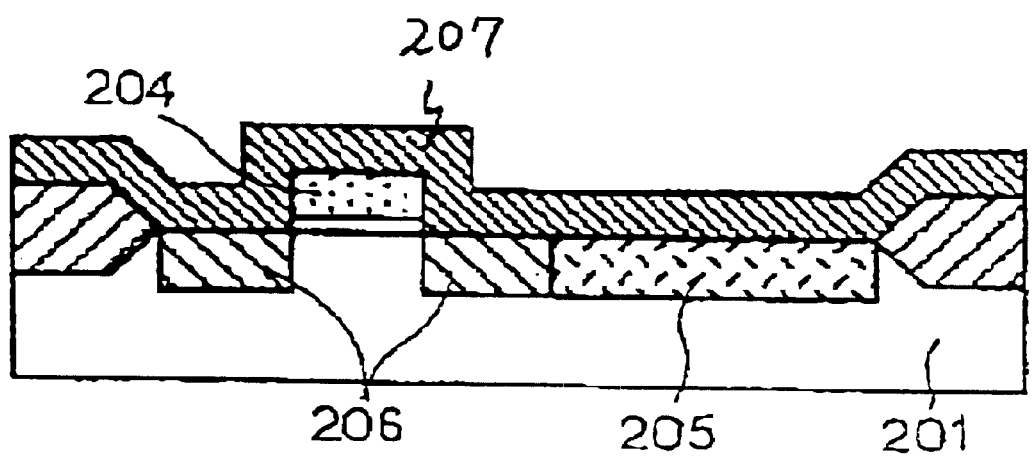

With reference to FIG. 3B, a thick silicon oxide film 207 having a thickness of about 100 nanometers is entirely formed which extends over the field oxide films 202, the n$^+$-type source and drain diffusion regions 206, the n$^-$-type diffusion region 205, and the polysilicon gate electrode 204. The thickness of the silicon oxide film 207 is so thick that the arsenic ion-implanted does not penetrate the silicon oxide film 207, whereby no arsenic is implanted into the n$^-$-type diffusion region 205.

Figure 3C:
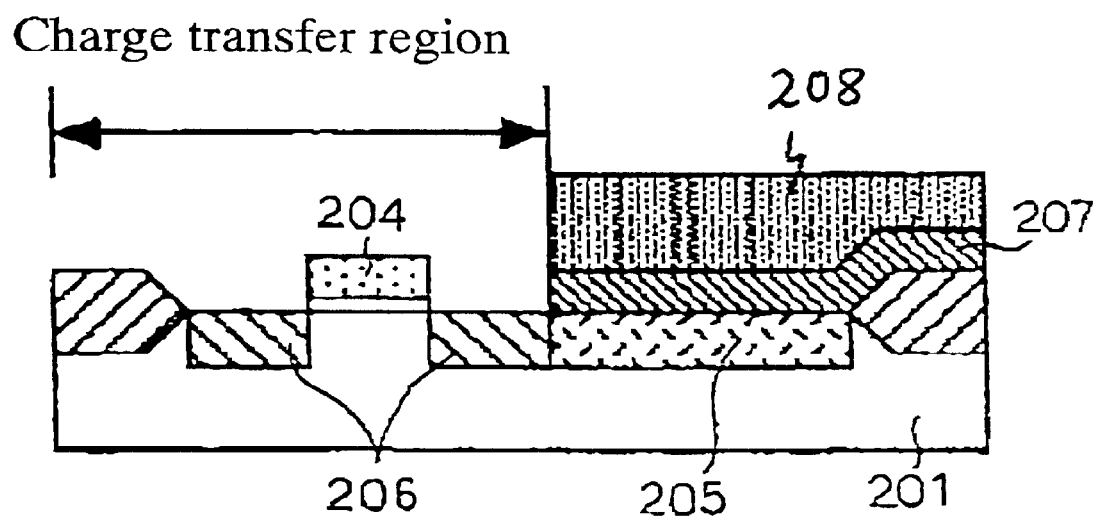
Figure 3D:
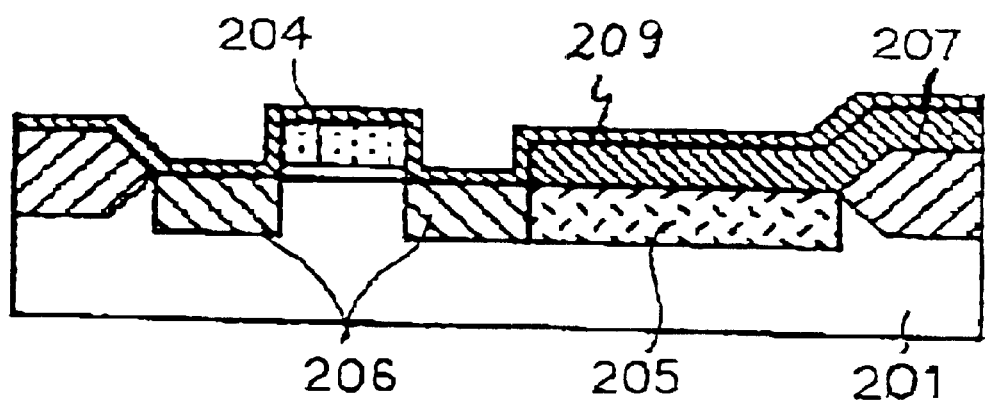

With reference to FIG. 3C, a photo-resist 208 is selectively formed on the silicon oxide film 207 in the photo-receiving region. The photo-resist film 208 is used as a mask for selectively removing the silicon oxide film 207 from the charge transfer region, whereby the polysilicon gate electrode 204 and the n$^+$-type source and drain diffusion regions 206 are shown With reference to FIG. 3D, the used photo-resist film 208 is removed. A silicon oxide film 209 having a thickness of about 25 nanometers is entirely formed which extends over the field oxide film 202, the n$^+$-type source and drain diffusion regions 206 and the polysilicon gate electrode 204 in the charge transfer region as well as over the silicon oxide film 207 in the photo-receiving region.

Figure 3E:
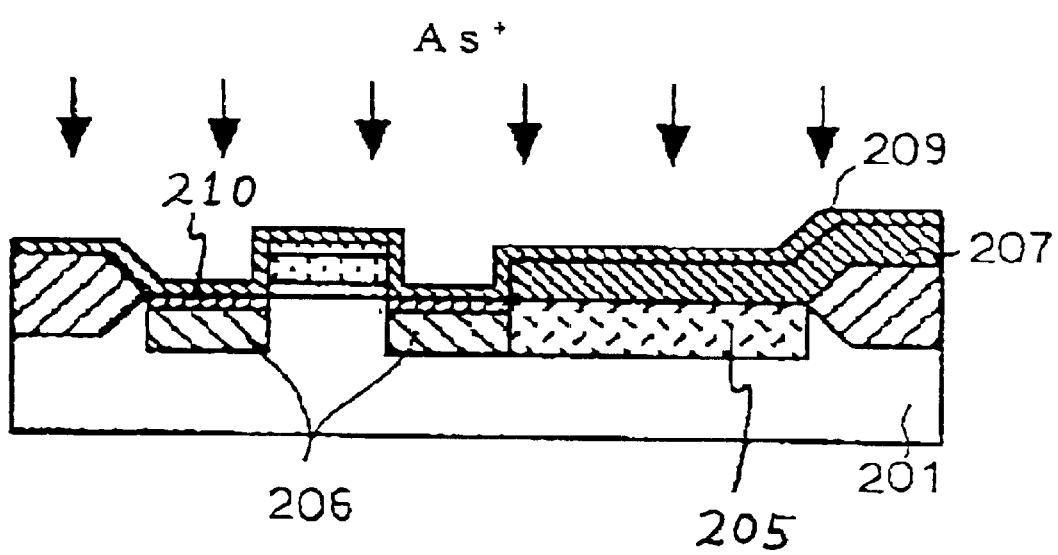

With recreance to FIG. 3E, an ion-implantation of an n-type impurity of arsenic is carried out at a dose of about 1E14 /cm2 to introduce the arsenic through the silicon oxide film 209 into upper regions of the polysilicon gate electrode 204, and the n$^+$-type source and drain diffusion regions 206 for making the above upper regions amorphous, whereby amorphous silicon layers 210 are selectively formed in the upper regions of the polysilicon gate electrode 204, and the n+-type source and drain diffusion regions 206 in the charge transfer region. The silicon oxide film 207 serves as a mask to prevent the arsenic ion-implanted from penetrating the silicon oxide film 207 and reaching the n−-type diffusion region 205. Namely, no arsenic is ion-implanted into the n−-type diffusion region 205. Since the silicon oxide film 207 extends only in the photo-receiving region but not extend in the charge transfer region, then the arsenic is ion-implanted only into the n+-type source and drain diffusion regions 206 and the polysilicon gate electrode 204 in the charge transfer region, whilst no arsenic is ion-implanted into the photo-receiving region. As a result, the amorphous silicon regions 210 are selectively formed in the upper regions of the n+-type source and drain diffusion regions 206 and the polysilicon gate electrode 204 in the charge transfer region, whilst no amorphous silicon. Region is then formed in the n−-type diffusion region 205 on the photo-receiving region.

Figure 3F:
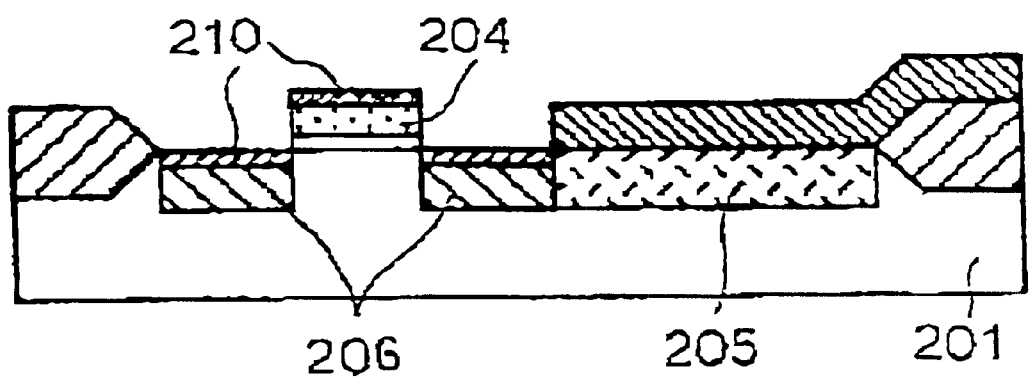

With reference to FIG. 3F, the silicon oxide film 209 is removed by a buffered fluorine acid solution, so that the silicon oxide film, 207 is shown in the photo-receiving region and also there are shown the amorphous silicon layers 210 over the polysilicon gate electrode 204 and the n+-type source and drain diffusion regions 206 in the charge transfer region. In place of the buffered fluorine acid solution, the day etching process using $CF_4$ gas may also be available to remove the silicon oxide film 209.

Figure 3G:
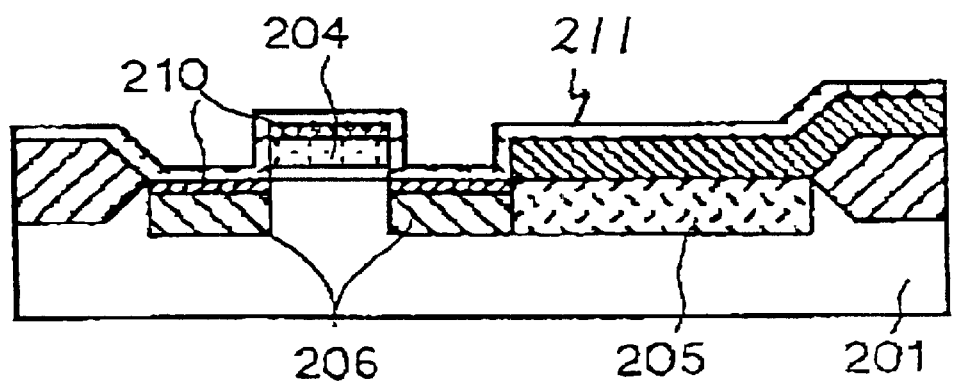

With reference to FIG. 3G, a titanium film 211 is entirely deposited by a stuttering method, so that the titanium film 211 extends over the field oxide film 202, the amorphous silicon regions 210 over the n+-type source and drain diffusion regions 206, and the other amorphous silicon regions 210 over the polysilicon gate electrode 204 in the charge transfer region as well as over the silicon oxide film 207 in the photo-receiving region.

Figure 3H:
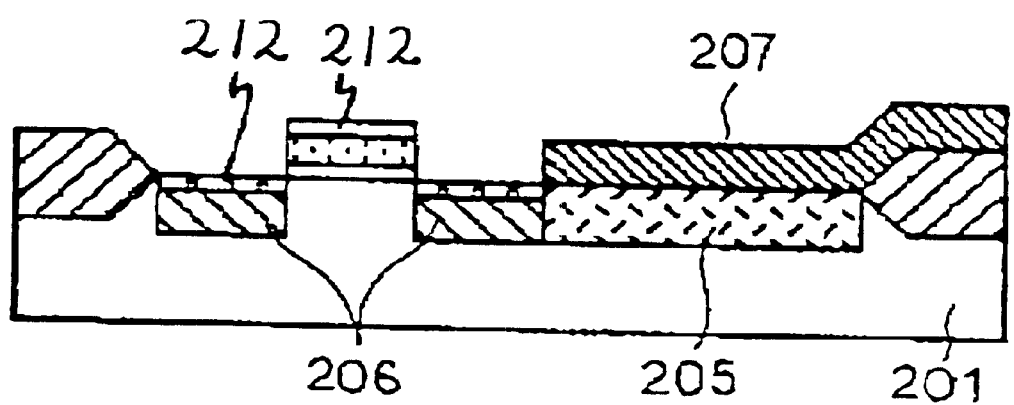

With reference to FIG. 3H, a heat treatment, for example, an anneal is carried out at a temperature in the range of 600–900° C. to cause a silicidation reaction of silicon in the amorphous silicon regions 210 with titanium of the titanium film 211, whereby titanium silicide layers 212 having a thickness of about 30 nanometers are selectively formed over the n+-type source and drain diffusion regions 206, and over the polysilicon gate electrode 204 in the charge transfer region, whilst the unreacted titanium film remains 211 remains over the field oxide film 202 and over the silicon oxide film 207 in the photo-receiving region. The unreacted titanium film 211 is then removed by a mixture of ammonia solution with hydrogen peroxide solution. As a result, the polycide gate is formed in the charge transfer region. Since the silicidation reaction is caused between the titanium film with the amorphous silicon regions 210, then the titanium silicide layers 212 are thick and have a reduced resistance.

Figure 3I:
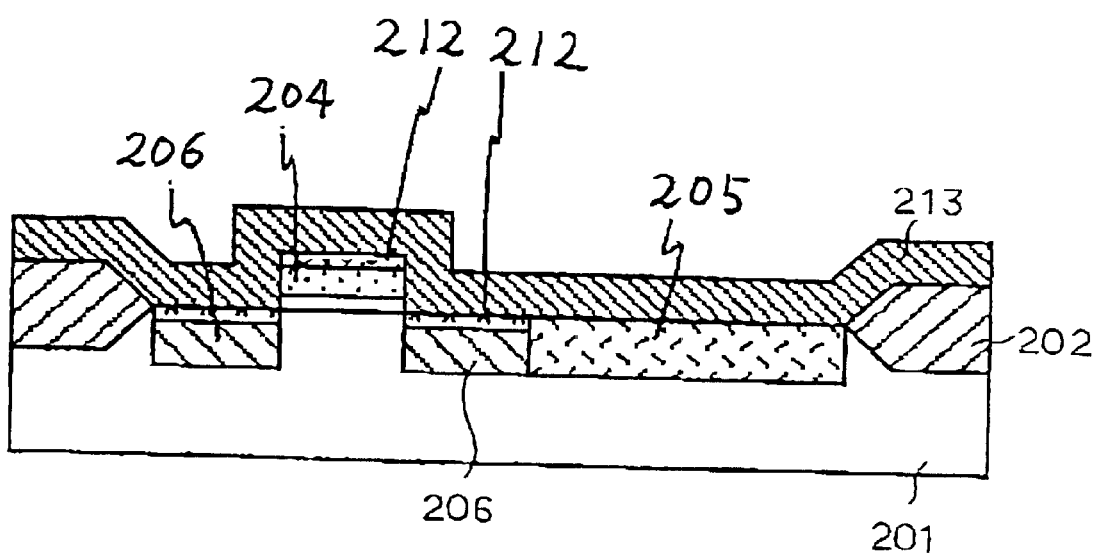

With reference to FIG. 3I, the silicon oxide film 207 is removed. An inter-layer insulator 213 is entirely formed over the charge transfer region and the photo-receiving region. Contact holes are selectively formed in the inter-layer insulator, so that the contact holes reach the titanium. silicide layers 212 over the n+-type source and drain diffusion regions 206. Contact plugs are selectively formed in the contact holes and an aluminum interconnection layer is formed over the inter-layer insulator so that the aluminum interconnection layer is connected through the contact plugs to the titanium silicide layers 212 over the n+-type source and drain diffusion regions 206.

As described above, in accordance with the second embodiment of the present invention, the thick silicon oxide film 207 is selectively formed in the photo-receiving region so that the thick silicon oxide film 207 covers the n−-type diffusion layer 205 having the low impurity concentration, before the arsenic is ion-implanted by use of the thick silicon oxide film 207 as a mask so that the arsenic is ion-implanted into the upper regions of the n+-type source and drain diffusion regions 206 having the high impurity concentration and the polysilicon gate electrode 204 in the charge transfer region, whilst no arsenic is then ion-implanted into the n−-type diffusion layer 205 having the low impurity concentration. As a result, the amorphous silicon layers are selectively formed over the n+-type source and drain diffusion regions 206 having the high impurity concentration and the polysilicon gate electrode 204 in the charge transfer region, whilst no amorphous silicon layer is then ion-implanted into the n−-type ion layer 205 having the low impurity concentration. A titanium film 211 is then entirely deposited over the charge transfer region and the photo-receiving region, so that the titanium film 211 extends over the field oxide film 202, the n+-type source and drain diffusion regions 206 and the polysilicon gate electrode 204 in the charge transfer region whilst the titanium film extends over the silicon oxide film 207 in the photo-receiving region. The silicidation reaction is caused of silicon in the amorphous silicon regions 210 with titanium of the titanium film 211 in the charge transfer region, whereby titanium silicide layers 212 are selectively formed over the n+-type source and drain diffusion regions 206, and over the polysilicon gate electrode 204 in the charge transfer region, whilst the unreacted titanium film remains 211 remains over the field oxide film 202 and over the silicon oxide film 207 in the photo-Receiving region. The unreacted titanium film 211 is then removed. As a result, the. high impurity concentration diffusion layers with the silicide layers are formed in the charge transfer region, whilst the low impurity concentration diffusion layers without silicide layers are formed in the photo-receive region. Since the titanium silicide layer 212 has a low light-transitivity, the titanium silicide layer 212 is selectively formed over the high impurity concentration diffusion layers only in the charge transfer region to reduce the high impurity concentration diffusion layers, whilst no titanium silicide layer is formed over the low impurity concentration diffusion layer serving as a photo-receiving region, whereby no deterioration to photo-sensitivity is caused. Since the low impurity concentration diffusion layer is low in the impurity concentration, then it is possible to extend a space charge region of the low impurity concentration diffusion layer to improve the sensitivity of the photo-receiving region. Accordingly, the improved CMOS sensor is obtained Third Embodiment:

A third embodiment according to the present invention will be described in detail with reference to the drawings.

FIGS. 4A through 4I are fragmentary cross sectional elevation views illustrative of a novel CMOS sensor having a photo-receiving region and a reset transistor, wherein the CMOS sensor has plural diffusion layers, parts of which are formed with silicide layers in a third embodiment in accordance with the present invention.

Figure 4A:
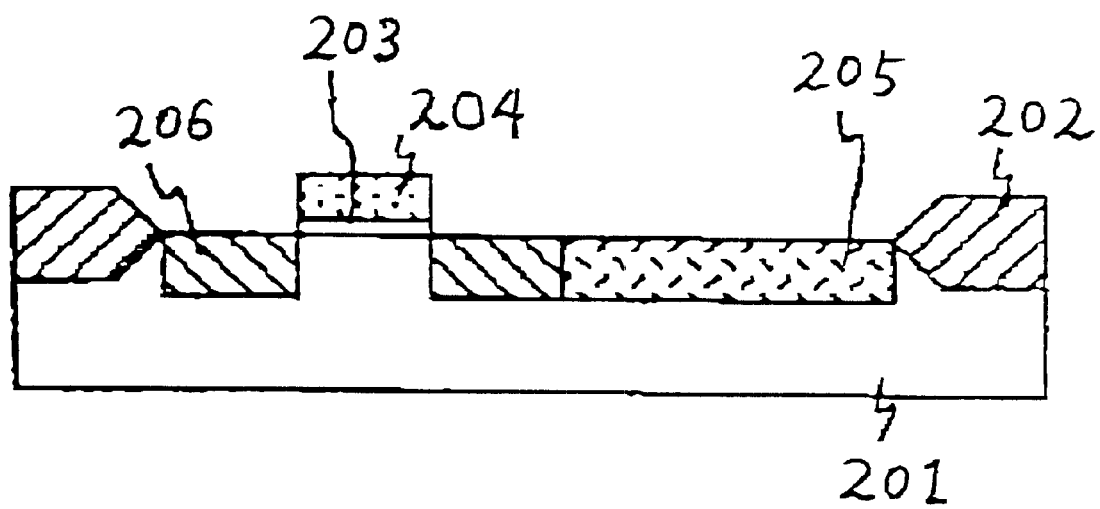
FIGS. 4A through 4I are fragmentary cross sectional elevation views illustrative of a novel CMOS sensor having a photo-receiving region and a reset transistor, wherein the CMOS sensor has plural diffusion layers, parts of which are formed with silicide layers in a third embodiment in accordance with the present invention.

With reference to FIG. 4A, field oxide films 202 are selectively formed on a passive region of a p-type silicon substrate 201 by a local oxidation of silicon method, whereby an active region or a device region is defined by the field oxide films 202. A gate oxide film 203 is formed on the device region or the active region of the p-type silicon substrate 201 by a thermal oxidation of silicon. A polysilicon film is entirely formed by a chemical vapor deposition method A phosphorus is doped into the polysilicon film to reduce a resistance of the polysilicon film. The polysilicon film is then patterned o form a polysilicon gate electrode 204. A photo-resist film is selectively formed for carrying out an ion-implantation of an n-type impurity into a shallow region of the photo-receiving region of the p-type silicon substrate 201 by use of the photo-resist as a mask at a low impurity concentration thereby to form an n⁻-type diffusion region 205 on the photo-receiving region of the p-type silicon substrate 201. The used photo-resist film is removed. In place, another photo-resist film is selectively formed. The other photo-resist film is used as a mask for carrying out another ion-implantation of an n-type impurity into a shallow region of the charge transfer region of the p-type silicon substrate 201 at a high impurity concentration thereby to form n⁺-type source and drain diffusion regions 206 on the charge transfer region of the p-type silicon substrate 201. One of the n⁺-type source and drain diffusion regions 206 is bounded with the edge of the n⁻-type diffusion region 205. The other photo-resist is then removed.

Figure 4B:
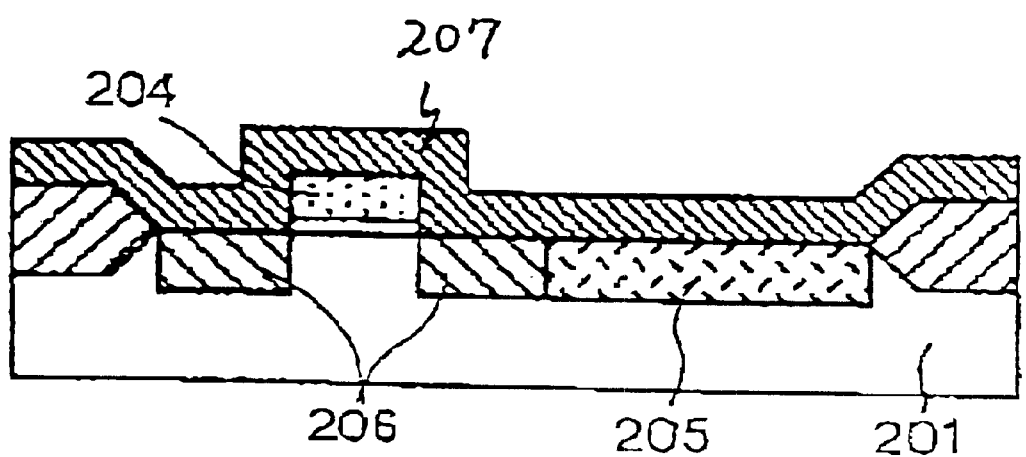

With reference to FIG. 4B, a thick silicon oxide film 207 having a thickness of about 100 nanometers is entirely formed which extends over the field oxide films 202, the n⁺-type source and drain diffusion regions 206, the n⁻-type diffusion region 205, and the polysilicon gate electrode 204. The thickness of the silicon oxide film 207 is so thick that the arsenic ion-implanted does not penetrate the silicon oxide film 207, whereby no arsenic is implanted into the n⁻-type diffusion region 205.

Figure 4C:
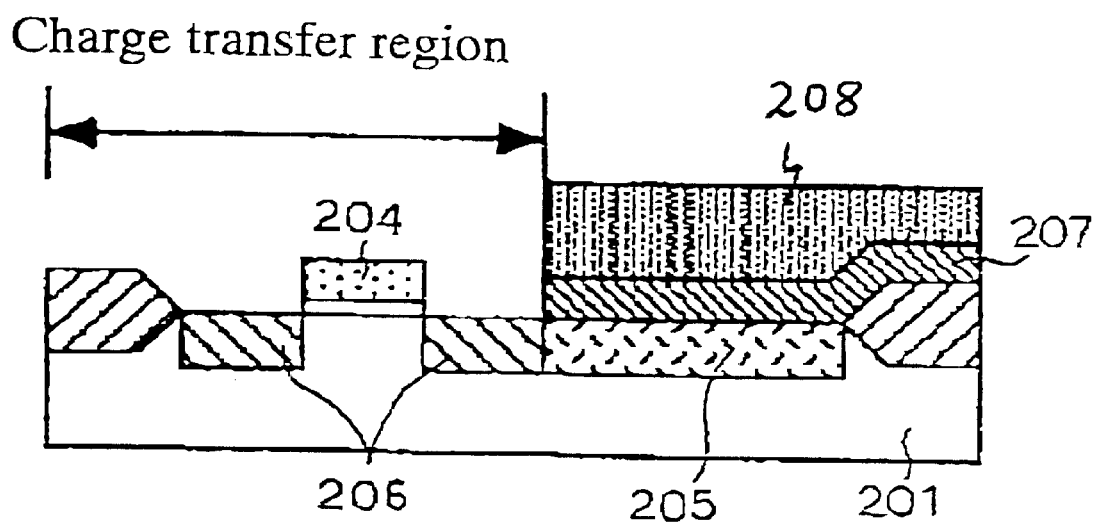

With reference to FIG. 4C, a photo-resist 208 is selectively formed on the silicon oxide film 207 in the photo-receiving region. The photo-resist film 208 is used as a mask for selectively removing the silicon oxide film 207 from the charge transfer region, whereby the polysilicon gate electrode 204 and the n⁺-type source and drain diffusion regions 206 are shown.

Figure 4D:
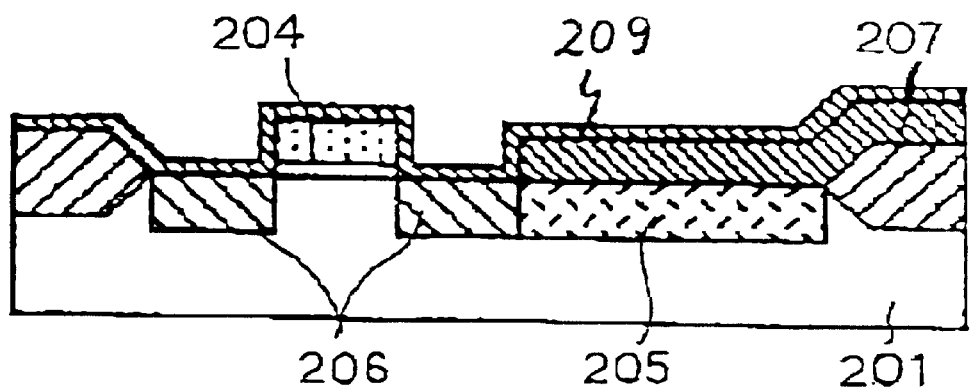

With reference to FIG. 4D, the used photo-resist film 208 is removed. A silicon oxide film 209 having a thickness of about 25 nanometers is entirely formed which extends over the field oxide film 202, the n⁺-type source and drain diffusion regions 206 and the polysilicon gate electrode 204 in the charge transfer region as well as over the silicon oxide film 207 in the photo-receiving region.

Figure 4E:
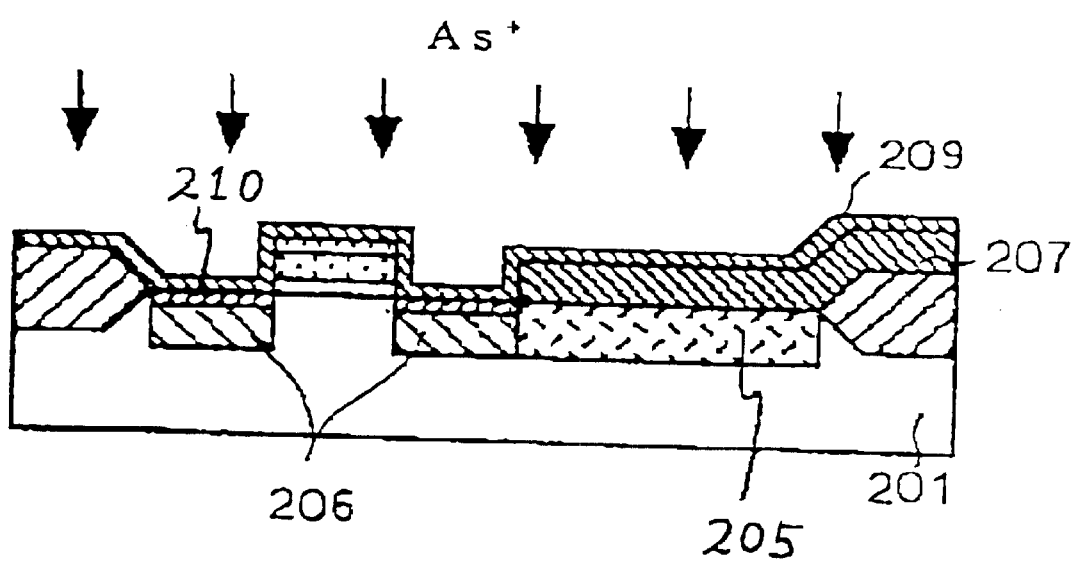

With reference to FIG. 4E, an ion-implantation of an n-type impurity of arsenic is carried out at a dose of about 1E14 /cm2 to introduce the arsenic through the silicon oxide film 209 into upper regions of the polysilicon gate electrode 204, and the n⁺-type source and drain diffusion regions 206 for making the above upper regions amorphous, whereby amorphous silicon layers 210 are selectively formed in the upper regions of the polysilicon gate electrode 204, and the n⁺-type source and drain diffusion regions 206 in the charge transfer region. The silicon oxide film 207 serves as a mask to prevent the arsenic ion-implanted from penetrating the silicon oxide film 207 and reaching the n⁻-type diffusion region 205. Namely, no arsenic is ion-implanted into the n⁻-type diffusion region 205. Since the silicon oxide film 207 extends only in the photo-receiving region but not extend in the charge transfer region, then the arsenic is ion-implanted only into the n⁺-type source and drain diffusion regions 206 and the polysilicon gate electrode 204 in the charge transfer region, whilst no arsenic is ion-implanted into the photo-receiving region. As a result, the amorphous silicon regions 210 are selectively formed in the upper regions of the n⁺-type source and drain diffusion regions 206 and the polysilicon gate electrode 204 in the charge transfer region, whilst no amorphous silicon region is then formed in the n⁻-type diffusion region 205 on the photo-receiving region.

Figure 4F:
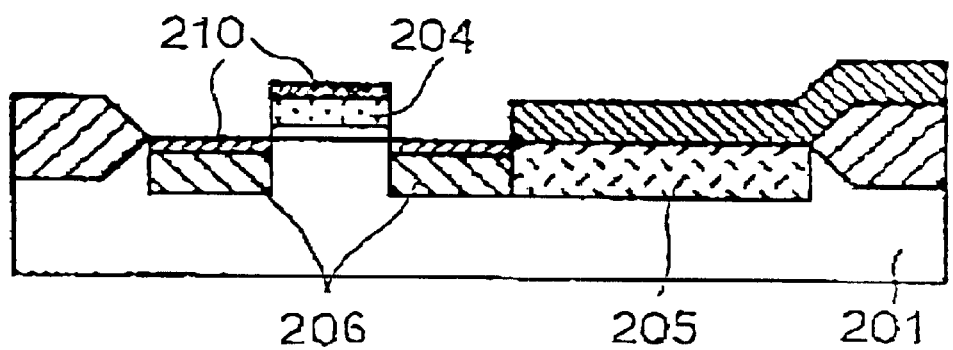

With reference to FIG. 4F, the silicon oxide film 209 is removed by a buffered fluorine acid solution, so that the silicon oxide film 207 is shown in the photo-receiving region and also there are shown the amorphous silicon layers 210 over the polysilicon gate electrode 204 and the n⁺-type source and drain diffusion regions 206 in the charge transfer region In place of the buffered fluorine acid solution, the dry etching process using $CF_4$ gas may also be available to remove the silicon oxide film 209.

Figure 4G:
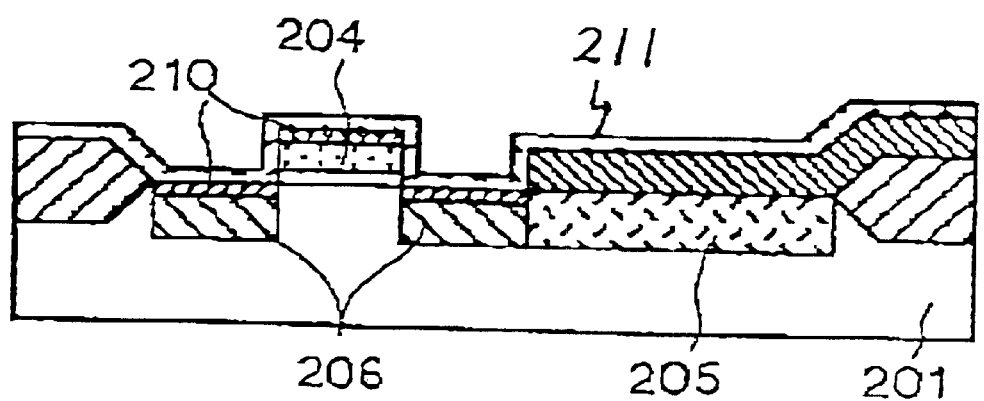

With reference to FIG. 4G, a titanium film 211 is entirely deposited by a stuttering method, so that the titanium film 211 extends over the field oxide film 202, the amorphous silicon regions 210 over the n⁺-type source and drain diffusion regions 206, and the other amorphous silicon regions 210 over the polysilicon gate electrode 204 in the charge transfer region as well as over the silicon oxide film 207 in the photo-receiving region.

Figure 4H:
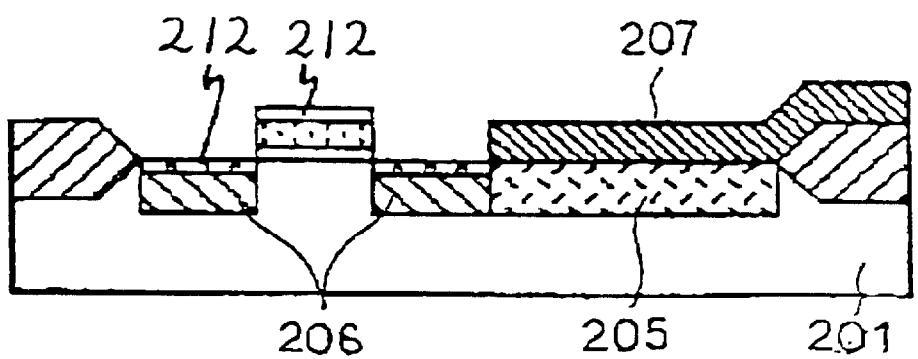

With reference to FIG. 4H, a heat treatment, for example, an anneal is carried out at a temperature in the range of 600–900° C. to cause a silicidation reaction of silicon in the amorphous silicon regions 210 with titanium of the titanium film 211, whereby titanium silicide layers 212 having a thickness of about 30 nanometers are selectively formed over the n⁺-type source and drain diffusion regions 206, and over the polysilicon gate electrode 204 in the charge transfer region, whilst the unreacted titanium film remains 211 remains over the field oxide film 202 and over the silicon oxide film 207 in the photo-Receiving region. The unreacted titanium film 211 is then removed by a mixture of ammonia solution with hydrogen peroxide solution As a result, the polycide gate is formed in the charge transfer region. Since the silicidation reaction is caused between the titanium film with the amorphous silicon regions 210, than the titanium silicide layers 212 are thick and have a reduced resistance.

Figure 4I:
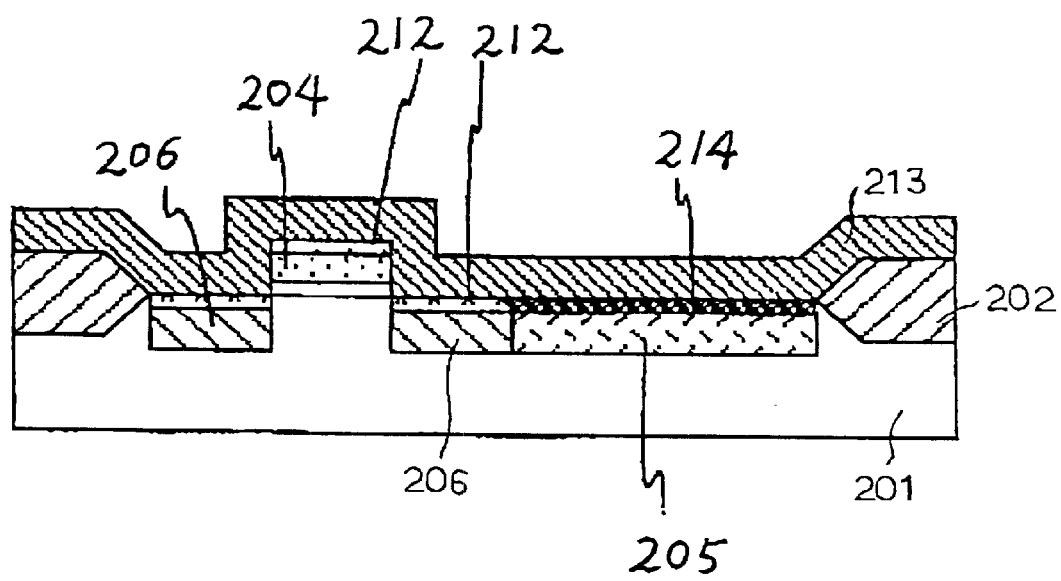

With reference to FIG. 4I, the silicon oxide film 207 is removed. A photo-resist film is selectively formed for carrying out an ion-implantation of p-type impurity into an upper region of the n⁻-type diffusion region 205 at a high dose, whereby a p⁺-type region 214 is selectively formed in the upper legion of the n⁻-type diffusion region 205. The used photo-resist is removed. An inter-layer insulator 213 is entirely formed over the charge transfer region and the photo-receiving region. Contact holes are selectively formed in the inter-layer insulator, so that the contact holes reach the titanium silicide layers 212 over the n⁺-type source and drain diffusion regions 206. Contact plugs are selectively formed in the contact holes and an aluminum interconnection layer is formed over the inter-layer insulator so that the aluminum interconnection layer is connected through the contact plugs to the titanium silicide layers 212 over the n⁺-type source and drain diffusion regions 206.

The above p⁺-type region 214 is effective to prevent noise charges from entering into the n⁻-type diffusion region 205 Namely, noise charges are generated from an interface state of an interface of the inter-layer insulator 213. However, the noise charges are then recombined in the p⁺-type region 214, whereby no noise charges enter into the n⁻-type diffusion region 205.

As described above, in accordance with the third embodiment of the present invention, the thick silicon oxide film 207 is selectively formed in the photo-receiving region so that the thick silicon oxide film 207 covers the n⁻-type diffusion layer 205 having the low impurity concentration, before the arsenic is ion-implanted by use of the thick silicon oxide film 207 as a mask so that the arsenic is ion-implanted into the upper regions of the n⁺-type source and drain diffusion regions 206 having the high impurity concentration and the polysilicon gate electrode 204 in the charge transfer region, whilst no arsenic is then ion-implanted into the n⁻-type diffusion layer 205 having the low impurity concentration. As a result, the amorphous silicon layers are selectively formed over the n⁺-type source and drain diffusion regions 206 having the high impurity concentration and the polysilicon gate electrode 204 in the charge transfer region, whilst no amorphous silicon layer is then ion-implanted into the n⁻-type diffusion layer 205 having the low impurity concentration. A titanium film 211 is then entirely deposited over the charge transfer region and the photo-receiving region, so that the titanium film 211 extends over tie field oxide film 202, the n⁺-type source and drain diffusion regions 206 and the polysilicon gate electrode 204 in the charge transfer region whilst the titanium film extends over the silicon oxide film 207 in the photo-receiving region. The silicidation reaction is caused of silicon in the amorphous silicon legions 210 with titanium of the titanium film 211 in the charge transfer region, whereby titanium silicide layers 212 are selectively formed over the n⁺-type source and drain diffusion regions 206, and over the polysilicon gate electrode 204 in the charge transfer region, whilst the unreacted titanium film remains 211 remains over the field oxide film 202 and over the silicon oxide film 207 in the photo-receiving region. The unreacted titanium film 211 is then removed, As a result, the high impurity concentration diffusion layers with the suicide layers are formed in the charge transfer region, whilst the low impurity concentration diffusion layers without suicide layers are formed in the photo-receiving region Since the titanium silicide layer 212 has a low light-transinittivity, the titanium silicide layer 212 is selectively formed over the high impurity concentration diffusion layers only in the charge transfer region to reduce the high impurity concentration diffusion layers, whilst no titanium silicide layer is formed over the low impurity concentration diffusion layer serving as a photo-receiving region, whereby no deterioration to photo-sensitivity is caused. Since the low impurity concentration diffusion layer is low in the impurity concentration, then it is possible to extend a space charge region of the low impurity concentration diffusion layer to improve the sensitivity of the photo-receiving region. Accordingly, the improved CMOS sensor is obtained.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of selectively forming a silicide layer in a semiconductor device having a first impurity concentration; at least a second diffusion layer having a first impurity concentration which is lower than said first impurity concentration, and said first and second diffusion layers being of the same conductivity type, said comprising the steps of:

forming a mask layer at least over said second diffusion layer;

carrying out a first ion-implantation of an impurity of the same conductivity type as said first and second diffusion layers by use of said mask layer as a mask so as to ion-implant said impurity into an upper region of said first diffusion layer, whereby an amorphous silicon layer is formed over said first diffusion layer whilst no amorphous silicon layer is formed over said second diffusion layer;

forming a metal layer on said amorphous silicon layer over said first diffusion layer and also on said mask layer; and carrying out a heat treatment to cause a silicidation reaction of metal in said metal layers with silicon in said amorphous silicon layer whereby a metal silicide layer is selectively formed over said first diffusion layer whilst no silicide layer is formed over said second diffusion layer.

2. The method as claimed in claim 1, further comprising the step of:

after forming said mask layer, entirely forming a thin silicon oxide film over said first diffusion layer and said mask layer, so that said first ion-implantation is made through said thin silicon oxide film into an upper region of said first diffusion layer, so that said amorphous silicon layer is formed over said first diffusion layer; and removing said thin silicon oxide film before said metal film is formed.

3. The method as claimed in claim 1, wherein said mask layer comprises a thick silicon oxide film having a thickness larger than a range of ions of said first ion-implantation, so that said impurity is prevented from penetrating said mask layer and reaching said second diffusion layer.

* * * * *